United States Patent
Brambilla et al.

[11] Patent Number: 5,828,245
[45] Date of Patent: Oct. 27, 1998

[54] DRIVER CIRCUIT INCLUDING AMPLIFIER OPERATED IN A SWITCHING MODE

[75] Inventors: Massimiliano Brambilla, San Jose; Gianluca Colli, Santa Clara, both of Calif.

[73] Assignee: STMicroelectronics, Inc., Carrollton, Tex.

[21] Appl. No.: 740,129

[22] Filed: Oct. 24, 1996

[51] Int. Cl.⁶ ........................................................ H03K 3/00
[52] U.S. Cl. ............................ 327/108; 327/170; 327/540
[58] Field of Search ................... 327/108–112, 374–377, 327/170, 434, 437, 540

[56] References Cited

U.S. PATENT DOCUMENTS

| | | | |
|---|---|---|---|
| 5,007,024 | 4/1991 | Tanaka et al. | 365/207 |
| 5,191,269 | 3/1993 | Carobolante | 318/254 |
| 5,306,988 | 4/1994 | Carobolante et al. | 318/254 |
| 5,374,857 | 12/1994 | Carobolante | 327/110 |
| 5,404,053 | 4/1995 | Poma et al. | 327/73 |
| 5,416,437 | 5/1995 | Contreras et al. | 327/536 |
| 5,490,111 | 2/1996 | Sakata | 365/189.01 |
| 5,514,939 | 5/1996 | Schlager et al. | 318/254 |

OTHER PUBLICATIONS

Gariboldi, "Motion Control," appearing in *Smart ICs*, Murari et al., Eds., 1995, Ch. 5, pp. 225–283.

Grebene, *Bipolar and MOS Analog Integrated Circuit Designs*, 1984, Sec. 4.1 pp. 171–183, and Sec. 6.2, pp. 271–277.

*Primary Examiner*—Kenneth B. Wells
*Attorney, Agent, or Firm*—Theodore E. Galanthay; Lisa K. Jorgenson; Gordon H. Telfer

[57] ABSTRACT

A driver circuit with an amplifier operated in a switching mode has threshold detectors with devices to compare the amplifier input and output voltage respectively to predetermined minimum and maximum levels representing fully off and fully on conditions for the driver circuit. The circuit provides signals to enable the amplifier to draw current from a supply only during transitions between the threshold levels and to otherwise disable the amplifier. The circuit is beneficial particularly when operating the amplifier from a voltage supply of very limited current capability, such as a charge pump voltage in an integrated circuit. The switching mode amplifier can be applied in high performance driver integrated circuits alone or in combination with innovative techniques for slew rate control and for preslewing the amplifier output that also provide high performance in compact circuit configurations.

22 Claims, 3 Drawing Sheets

DRIVER CIRCUIT INCLUDING AMPLIFIER OPERATED IN A SWITCHING MODE

RELATED APPLICATIONS

This application is generally related in subject matter to the following applications by the same inventors and assigned to the same assignee which contain other inventions relevant to driver circuits: Ser. No. 740,195 and Ser. No. 736,524, both filed the same date as the present application.

BACKGROUND OF THE INVENTION

1. Field of the Invention

The invention relates to drive circuits for a power device of a power driving stage and particularly to a driver circuit operating from a supply voltage (e.g., a charge pump voltage) that is higher than the supply voltage of the power device.

The invention is particularly beneficial for high side drivers in integrated circuits for energizing spindle motor coils, such as for hard disk drives.

2. Description of Related Art

A driver circuit is generally a relatively low power circuit that drives, or controls, a higher power device. The power device may be part of a power driving stage for a load. An example is a load that is a motor, such as a brushless motor, that provides the motive force for a spindle of a hard disk drive. Similar driver circuits are also applied elsewhere, such as for voice coil motor (VCM) systems.

One of the most widely used drivers in such applications uses a three-phase brushless motor in a driving configuration in which current energizes respective motor coils using a full wave bridge configuration. The bridge includes two power stages for each phase, so typically there are six power stages, each with a power device. Three of the power stages, and their power devices, are referred as being "low side" stages and devices because they are connected between a motor coil and ground. The other three of the power stages, and their power devices, are referred to as "high side" stages and devices because they are connected between a power supply and a motor coil.

The power devices are operated as switches in a sequence that allows pulses of current to flow from the power supply through a high side power device, a coil of a first of the three stages, a coil of a second of the three stages, and then through a low side power device to ground. This process is repeated in a generally well known manner for the other power devices and coil pairs to achieve three phase energization from a single, direct current, power supply. The switching, or commutation, characteristics of the power devices are very important in achieving good performance from the motor and other favorable characteristics.

Control of the switching of the power devices is performed by a driver circuit for each power device. In the typical case described above with six power stages, there are three low side drivers and three high side drivers. The power devices may be of a variety of electronic switch devices and the driver circuits are configured suitably for the power devices. Power devices of general application to hard disk drives, and the like, are each often an MOS (metal-oxide-semiconductor) FET (field effect transistor). One type of such transistors of considerable interest is referred to as a DMOS transistor (D referring to a double diffusion process used in its manufacture).

DMOS devices can be readily integrated in chips with other circuitry, including lower power control circuitry. So it is attractive to have an entire set of drive stages, including all the power devices and all the driver circuits for the power devices, all in one chip.

Even where all the power devices are alike, e.g., N channel DMOS devices, it is generally the case that the high side drivers differ from the low side drivers because high side drivers for such power devices often require a voltage, referred to as a charge pump voltage or boost voltage, at a higher voltage level than that supplied by the power supply for the power stages. By known techniques, a charge pump voltage may be generated from the supply voltage and used by all the high side drivers. Such an auxiliary supply is, however, power limited; the desired voltage can be supplied but at a modest current level.

The state of the art in the field of motion control using integrated signal and power components, the respective requirements of low and high side drivers, and the characteristics sought in applications of motor drives are described more fully in *Smart Power ICs*, B. Murari et al. (Eds.), 1995, particularly Chapter 5, "Motion Control" by R. Gariboldi, at pp. 225–283, which is herein incorporated by reference for its description of background to the present invention.

One of the most severe requirements for a high side driver is to maintain a low total power consumption so all the high side drivers, e.g., three in the typical case, can be integrated together and operated from the same internal supply of the charge pump voltage. Such a supply is called a central charge pump or a voltage overdrive generator.

Typically, and merely by way of example, there may be an external reference voltage supplied to the power stage at a fixed voltage in the range of about 12 v. to 17 v. D.C. That is a voltage that appears across the channel of an MOS power device, between its source and drain. However, a charge pump voltage of up to 10 v. higher, or 27 v., is required to drive the power device. Known central charge pumps can provide the required voltage but only at a D.C. current that is, for example about 2 mA. When used by a plurality of drive circuits, as well as possibly some auxiliary devices in the same integrated circuit, the available current is quite limited.

High side drivers generally have an amplifier that is biased by the charge pump voltage. The amplifier, such as an op-amp, is specifically designed to try to minimize current requirements. Still, it has been the case that the driver amplifiers are operated so that they draw a current from the charge pump throughout operation. During transitions of the power devices, the bias current peaks. Even between transitions, however, there is normally a continuous bias current. That makes the power consumption higher than would be desired.

Slew rate control circuitry is used to help ensure that the transitions are satisfactory. Since the load is usually an inductive load, there can be recirculation effects and consequent noise and electromagnetic interference (EMI) if the switching of the power devices occurs too abruptly. Slew rate control circuits still leave the problem of having to live with the limited current produced by the charge pump supply.

SUMMARY OF THE INVENTION

This invention addresses the need for a driver with lower current requirements and lower power consumption. Generally, the driver circuit has an amplifier, such as an op-amp, for driving a power device, such as a DMOS transistor. Instead of a continuous bias on the amplifier, the invention achieves operation in a switching mode.

Similar to the prior art for a high side driver, the invention has a first power supply for supplying the power device, such as from an external supply, for the voltage across the transistor source and drain. The amplifier drives the gate voltage, according to command signals it receives. Because of the characteristics described in the background, the amplifier is biased by a second power supply, such as an internal charge pump supply at a higher voltage. The bias is controlled so that the amplifier draws current only during transitions of the power device between on and off conditions and draws substantially zero current at other times when the power device is either on or off and no command signal has been received to make a transition.

The means for operating the amplifier in a switching mode can take various forms among which are those in which threshold detectors for detecting the drive conditions are used. The threshold detectors may comprise conventional comparators.

Consistent with present high side drivers, a capacitor is charged and discharged according to the command signals. With the present invention, when the capacitor reaches a predetermined voltage, it is known by the threshold detectors that the power device is on. Under those conditions, and continuing until a command signal causes a discharging of the capacitor to commence, the amplifier is disabled by a signal from the detectors and consumes no bias current. When discharging of the capacitor commences, an enable signal is provided to the amplifier. When the capacitor has been discharged, indicating the turn off of the power device, the threshold detectors again provide a disable signal to switch off the amplifier. Consequently, the amplifier is only on and consuming current when there is a positive need for it.

The invention has particular benefits in the case of drive systems including a plurality, e.g., three, high side driver circuits all receiving their charge pump voltage from the same internal supply, where, by normal practice, there would be continuous current demands. The invention achieves precise commutation with even less current demands on the charge pump supply. Even a bias current of about 10 mA. during commutation is satisfactory because it will only occur for about 2 microseconds and the rest of the time the current is zero. That is much better than to have a lower current, e.g., only about 1 mA., all the time. The invention has more general applications but is especially important for multiple driver circuits in a single integrated circuit chip, as in chips where a bridge of power devices is used to selectively energize coils of a motor driving data storage apparatus, such as a hard disk drive.

The method of the invention includes, for example, sensing the gate voltage and the capacitor voltage at the input of the amplifier, comparing the sensed voltages with high and low thresholds, generating an enable signal to the amplifier when the power device is to be commutated, and generating a disable signal to the amplifier when a commutation has been completed.

In one aspect of the invention, it is favorable for achieving good overall characteristics to have driver command signals applied to the threshold detectors and to the circuit branch coupled to the amplifier input, but preferably with a time delay between the two. The time delay can be brief, such as about 1 microsecond. That insures the op-amp is fully operative when needed.

The present improvement for operation of a high side driver amplifier in a switching mode may be used independently but may also be combined with one or more other improvements for high side drivers which are further described in the above-mentioned related applications. The foregoing and additional aspects of the present invention will become more apparent from the following description and accompanying drawings.

DESCRIPTION OF PREFERRED EMBODIMENTS

Figure 1:
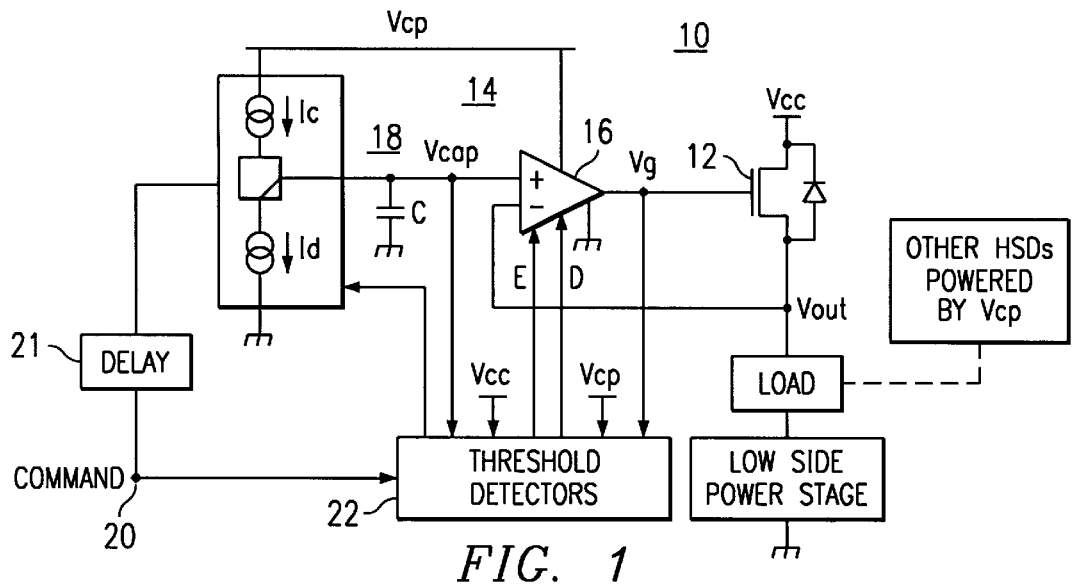
FIG. 1 is a schematic circuit diagram of an embodiment of the present invention in a high side driver circuit.

Referring to FIG. 1, a power driving stage 10 is shown. The power driving stage 10 includes a power device 12 that, in this example, is an MOS transistor, more specifically an N-channel DMOS transistor. DMOS transistors are known power devices and device 12 is illustrated with a diode schematically shown between source and drain that occurs in the structure of such devices.

Power device 12 has a controllable conduction path through a channel between its drain and source. A gate electrode serves as a control electrode for controlling conduction through the channel.

Power driving stage 10 with power device 12 includes a driver circuit 14 for controlling the voltage at the gate of device 12 and therefore the conduction of the power device.

In this example, power device 12 is connected for selectively applying power to a load which is above ground potential. Driver circuit 14 is therefore referred to as a high side driver. The load is shown for illustration coupled with a low side power stage that goes to ground. The circumstances described in the background above show particular requirements of high side DMOS drivers that are to be improved, particularly where the load is inductive motor coils of multiple phases with additional high side driver circuits (shown also connected with the load) all integrated with power stage 10 in the same chip.

The power device 12 receives a DC voltage Vcc from a first power supply connected to its drain. Vcc is typically from an external supply and is equal to about 12 to 17 v. The characteristics of DMOS devices, like device 12, require a second voltage Vcp to be provided at a voltage level higher than Vcc, e.g., 27 v. Vcp is a charge pump or boost voltage or overvoltage typically generated by known means within the chip.

In the driver circuit 14, charge pump voltage Vcp is supplied to an amplifier 16 and also to a slew rate control circuit portion 18 represented by a slew rate capacitor C, that is charged and discharged by constant current sources Ic and Id.

In basic operation, command signals in the form of "0" or "1" logic are received by driver circuit 14 at a command terminal 20. For example, a "1" signal may be a command to the driver 14 to stay or go off with a low gate voltage Vg and a "0" signal may be a command to stay or go on with a high Vg. Particular attention is to be given to the transitions or commutations of the power device 12 when the command signal changes value. When the power device 12 is to go from off to on, Vg is to be driven smoothly at a slew rate proportional to the current of source Ic divided by capacitance C. Upon a command for an on to off transition, a smooth decline in Vg occurs at a slew rate proportional to the current of source Id divided by the capacitance. (Precise slew rate control of vg is needed in the range from 0 v. to Vcc; more abrupt voltage changes may occur between Vcc and Vcp.)

Amplifier 16 may, for example, be an operational amplifier or op-amp. The capacitor voltage Vcap is applied to the positive input terminal (+) of the amplifier 16. A feedback signal from the source of power device 12, the output voltage Vout, is applied to the negative input terminal (−) of the amplifier 16. By known amplifier techniques, the amplifier 16 operates on the inputs, using power from Vcp, so the gate voltage Vg ranges between an off level of zero and an on level of Vcp.

FIG. 1 incorporates techniques so the amplifier is operating in a switching mode and utilizes current from the supply of Vcp only during transitions and not during periods when the power device 12 is to stay fully on or fully off.

According to the present invention, monitors such as threshold detectors 22 are connected to receive signals indicating the status of the capacitor voltage Vcap and the gate voltage Vg. The threshold detectors determine when the amplifier 16 has transitioned Vcap and Vg to the required threshold levels. When the required voltage levels have been reached and the commutation no longer requires action by the amplifier 16, the amplifier is disabled and no longer conducts current from the Vcp supply.

In implementing the invention, it is suitable for the threshold detectors 22 to be comparators. The comparators compare the sensed signals to programmed thresholds to determine when an enable signal E or a disable signal D should be applied to the amplifier 16. The requisite threshold to be compared, either a high or low threshold, is determined by the receipt of a command signal from command terminal 20.

Figure 2:
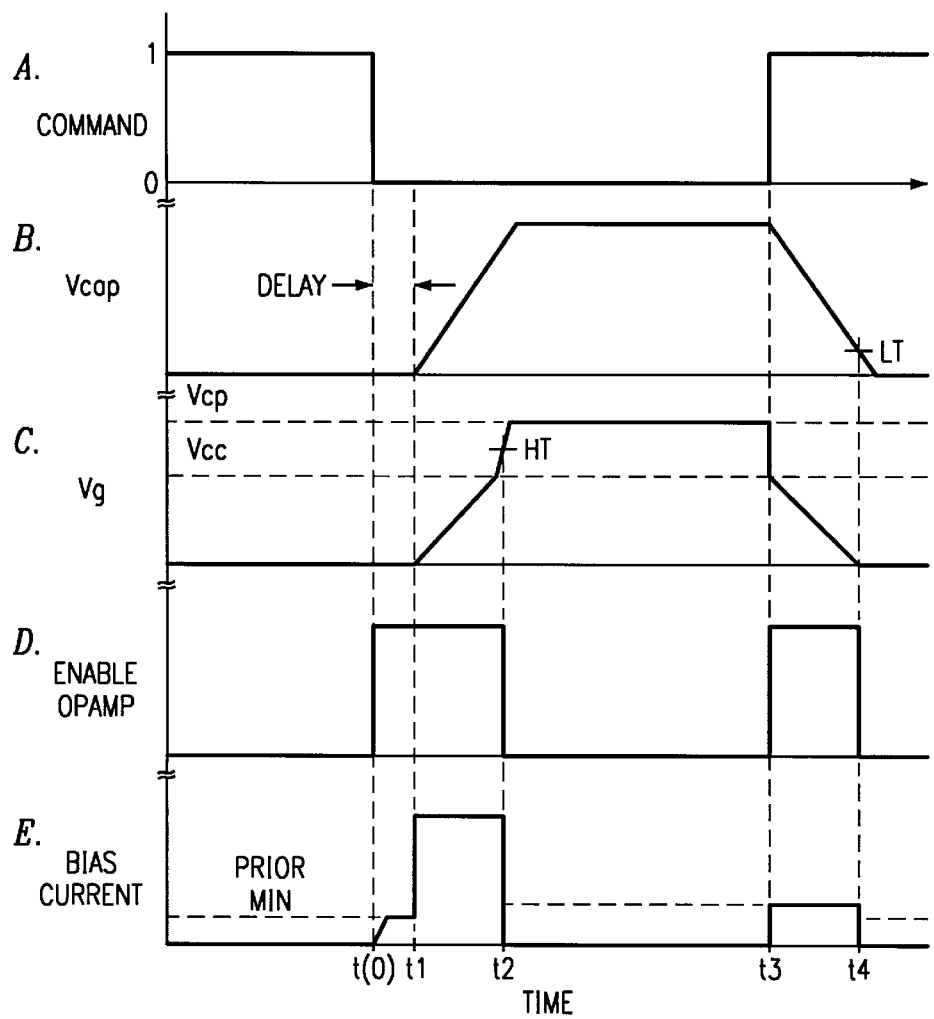
FIG. 2 is a set of waveforms generally showing variation of parameters in a circuit such as that of FIG. 1.

Referring now to FIG. 2, an illustration of the manner in which the invention operates is presented. FIG. 2 correlates various parameters on a common time axis, t. In part A are shown variations in command signals. Part B has the ramp voltage Vcap. Part C shows variations in Vg. Part D is a plot illustrating the time periods in which the op-amp is enabled. Part E shows the variation in bias current in operation of the invention as well as prior standard operation.

At t(0), there is an off to on command and the op-amp 16 is enabled for operation. That initiates a standby bias current to the amplifier for the brief period determined by the time delay 21 in the schematic between command terminal 20 and the slew rate control 18. The time delay may be of the order of 1 microsecond. After the time delay, t1, a full bias current is applied to the amplifier and the capacitor voltage starts to ramp up and so does Vg. The Vcap continues up to its maximum, at or near Vcp. However, even before Vcap reaches its maximum, Vg reaches a threshold level, HT, at time t2 at which the op-amp is disabled, by means of the threshold detectors 22, and its bias current drops to zero. The threshold HT may be Vcp minus 3Vbe where Vbe is a voltage across a transistor junction. Although the amplifier goes off at t2, the gate voltage still rises until Vg is at Vcp due to operation of the feedback from Vout to the input of amplifier 16.

When an on to off command is received at time t3, the Vcap starts down. The amplifier is again enabled and its bias current goes up. The bias current on discharge of Vg can be lower (than while turning on Vg) because the current is being sinked to ground. The bias current stays on until Vcap reaches the low threshold, which may be at 1 Vbe, and the threshold detectors 22 disable the amplifier. This occurs at t4 when it is sure that Vg is at a 0 level and a power device is off.

The time delay 21 may be provided by known techniques. One example is to include a combination (not shown) comprising a series string of inverters, such as four in number, with a capacitor connected between their mid-point and ground. The delay is not always necessary but is desirable to have in preferred forms of the invention to ensure the op-amp is fully operative.

FIG. 2, part E, also indicates a current level, PRIOR MIN., that would be drawn by the amplifier 16 between transitions if it was not operated in a switching mode as provided by this invention. It is of great benefit, particularly for integrated high side drivers, not to require the Vcp supply to provide a continuous bias and not to have the continuous power loss that results. It is satisfactory to get a sufficient bias current, even as high as about 10 mA., for the brief time required of about 2 microseconds for each commutation. However, if in addition it was necessary to supply a low current between transitions of perhaps no more than about 1 mA., it would be a serious handicap. The present invention gives a lower power consumption and allows a compact chip design.

The invention is beneficial where amplifier 16 is of any amplifier circuit design. Amplifiers can be made according to known techniques to achieve high slew rates and to provide a voltage buffer capable of driving a high capacitance, such as the gate capacitance of the power device 12. For high side drivers of particular interest, it is desirable to have an amplifier that has a slew rate in a wide range, such as from about 1 to about 35 v/microsecond, low standby bias current requirements (particularly if sometimes not used in a switching mode), and capable, without junction breakdown and terminal stress, of operation with a relatively high power supply voltage, such as from about 20–30 v.

Figure 3:
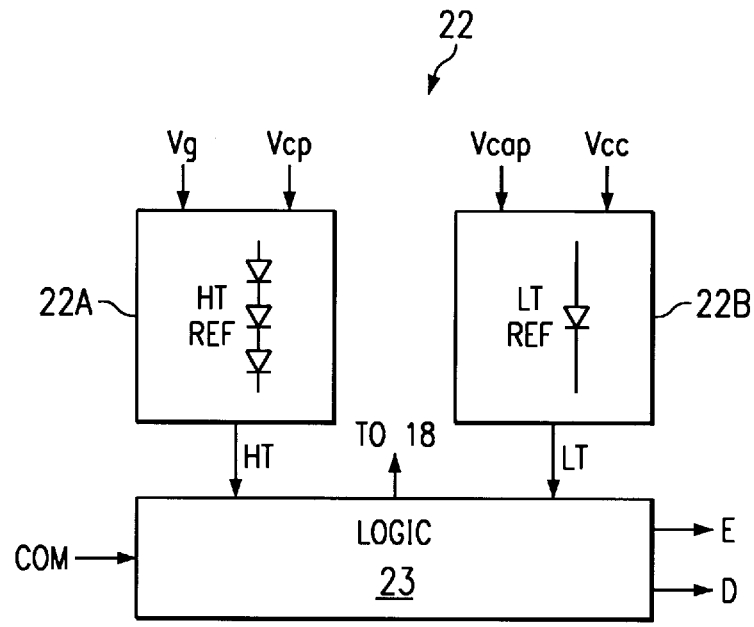
FIG. 3 is a circuit schematic further illustrating certain aspects of an embodiment of the invention.

Referring to FIG. 3, it gives a block diagram illustrating generally how the threshold detectors 22 of FIG. 1 are arranged to give the performance shown and described in connection with FIG. 2. In block 22A Vg is compared to a reference equal to 3 Vbe developed by the supply Vcp and three PN junction diodes. A signal, such as "1", is generated when Vg exceeds the reference, otherwise a "0" appears on the HT line. In block 22B, Vcap is compared to a reference equal to 1 Vbe developed by Vcc and one PN junction diode. A signal such as a "1", is generated when Vcap is less than its reference, otherwise a "0" appears on the LT line.

The unit 22 also includes logic 23 for processing LT and HT signals in relation to on or off commands from the command terminal 20. The logic 23 may be configured in various ways to enable the amplifier by an enable signal E when Vg is charging up, due to an on command, but is not yet to HT and also when Vcap is discharging down, due to an off command, but is not yet to LT. When those thresholds are reached, the enable signal E goes off (and/or a disable signal D goes on) and the amplifier is no longer powered.

In general, either Vg or Vcap can be monitored and compared to thresholds both in turning on and turning off transitions. The particular system described, with Vg monitored during turn-on and Vcap monitored during turn-off, is one suitable form but does not preclude others.

Figure 4:
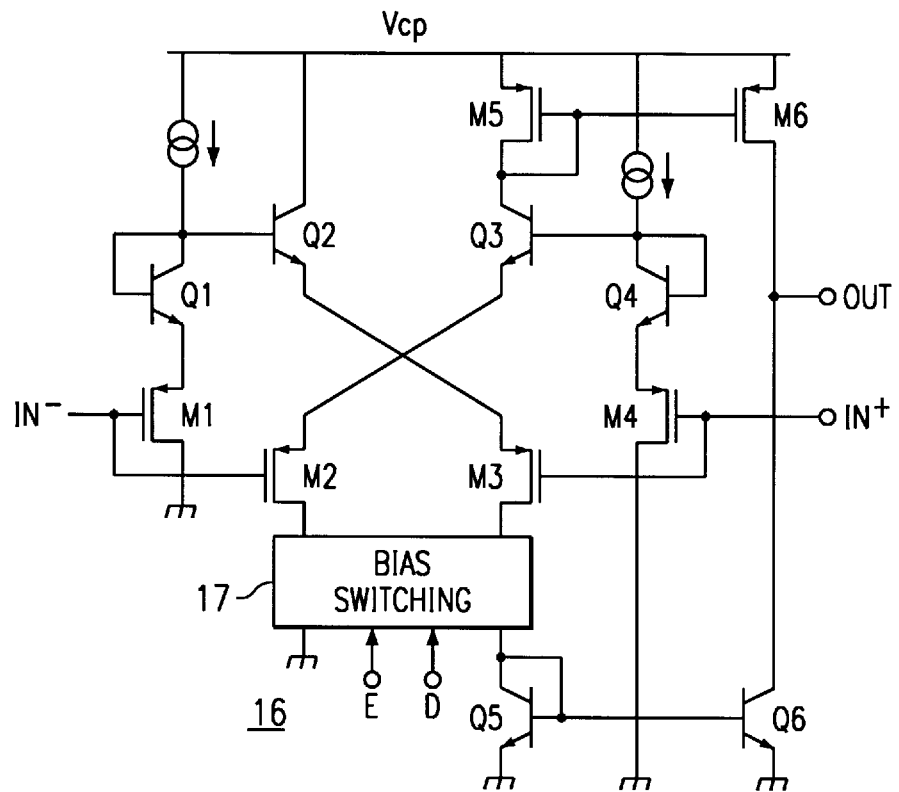
FIG. 4 is a circuit schematic of an example amplifier which may be used in circuits such as that of FIG. 1.

Referring to FIG. 4, a circuit schematic is shown that is an example of an amplifier for providing the above mentioned qualities. It is basically a single stage operational amplifier (op-amp) with a class A/B output stage. In this example, a known op-amp design for low power and low voltage applications is modified by using high voltage, DMOS devices (e.g., P channel transistors M1, M2, M3, M4, M5 and M6) and bipolar transistors (e.g., NPN transistors Q1, Q2, Q3, Q4, Q5, and Q6) connected as shown. The input stage comprising M1, M2, M3, M4, Q1, Q2, Q3 and Q4 has two branches (one with M1 and Q1 and the other with M4 and Q4) working as level shifters and two other branches (M2 and Q3; Q2 and M3) that during standby conditions carry only a bias current (e.g., about 40 microA.) but which are able to carry all the current necessary to drive the output capacitance during the transitions.

The output stage of the amplifier 16 of FIG. 4 consisting of M5, M6, Q5 and Q6 is a simple class A/B output stage able to drive the load with a current equal to input stage transient current multiplied for the mirror factor.

Compared to other known op-amp designs, FIG. 4 requires very low bias current which is particularly favorable in high side drivers with a charge pump supply with a limited current; and even more when multiple high side drivers depend on the same supply.

In addition, since FIG. 4 is a single stage op-amp it does not require additional compensation capacitance (i.e., dominant pole compensation with the gate capacitance). That saves chip area and voids stability problems.

The amplifier 16 of FIG. 4 is shown with a bias switching circuit portion 17 that receives the enable and disable signals E and D to switch the bias to the amplifier on or off. The bias control by block 17 of respective input stage transistors M2–Q3 and M3–Q2 is an example of implementing a switching mode operation of an amplifier in the inventive combinations.

Figure 5:
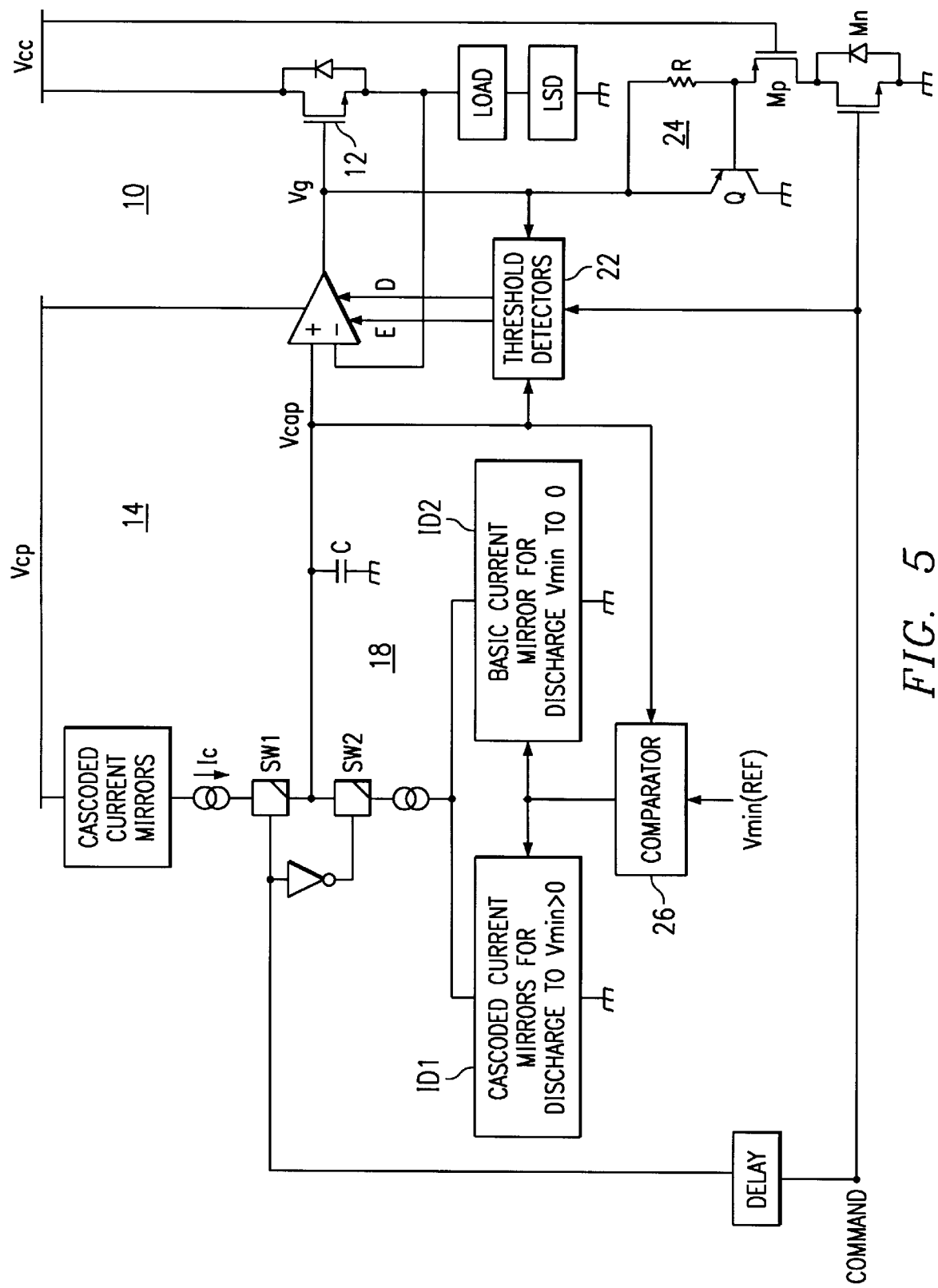
FIG. 5 is a circuit schematic showing an embodiment of the invention that includes the improvement of FIG. 1 and other improvements.

Referring to FIG. 5, it shows the previously described improvement for operation of a driver amplifier 16 in a switching mode in combination with other driver circuit improvements.

The driver circuit 14 of FIG. 5 has, in addition to the elements shown in FIG. 1, a preslewing circuit 24 connected to the gate terminal of power device 12 and also has a different arrangement of current sources in a slew rate control system 18.

The preslewing circuit 24 is provided to rapidly drop voltage on the gate of the power device 12, during a transition from on to off, from its maximum at Vcp to a level of substantially Vcc at which Vout to the load can start to slew down. (See FIG. 2, part C, where Vg drops quickly to Vcc at the start of a turn-off transition.)

The preslewing circuit 24 comprises a bipolar transistor Q connected in a first circuit branch between the gate of device 12 (emitter of Q) and ground (collector of Q) and also a complementary pair of field effect transistors Mn and Mp connected as shown in a second circuit branch between the gate of device 12 and ground. Conductivity types are shown for an example with an N-channel DMOS power device 12.

Mn is preferably a DMOS type device. It has a gate for receiving command signals, source connected to ground, and its drain connected to the drain of Mp. Mp has its gate connected to receive a voltage of the level to be reached during the preslewing, Vcc, from the same power supply as for power device 12. The source of Mp is connected to the base of Q and, through resistor R, the emitter of Q. The arrangement provides high conduction by the bipolar transistor to avoid any substantial delay in reducing the output voltage after an off command. When integrated by common techniques, the preslewing circuit 24 requires only a small chip area and yet has effective internal isolation against unwanted DC paths, despite the relatively high voltages.

Further description of preslewing circuits, including those like circuit 24, is contained in copending application Ser. No. 740,195 referred to above (Attys. Docket No. 96-S-81), which is herein incorporated by reference.

The slew rate control system 18 of FIG. 5 includes elements forming a voltage ramp generator that ranges linearly between Vcp and 0 for the capacitor voltage, and yet has high current conduction capacity without requiring much chip area when integrated.

This example has a charging current source Ic for capacitor C and a first and a second discharging current source Id1 and Id2. The arrangement with switches Sw1 and Sw2 and a comparator as shown, provides for fully charging the capacitor by Ic and discharging it in a sequence of, first, Id1 from the maximum voltage to a lower level, preferably near zero, and then Id2 from the lower level to zero. Ic and Id1 are current sources with large capacity and high linearity, such as cascode connected current mirrors, and Id2 is a current source, such as a basic current mirror, that insures discharge substantially to zero.

With high current capacity sources like Id1, with cascoded transistors, discharging to zero is not possible. Yet discharging to zero is necessary for completing turn off of device 12. Source Id1 can discharge to a level determined by its inherent voltage drop which can be appreciable.

The capacitor voltage is monitored and compared by a comparator 26 to a reference voltage Vmin (Ref.) which is of a low value within the capability of Id1, such as 2 Vbe. At that level in the discharge a signal from the comparator 26 to Id2 and through an inverter to Id1, turns off Id1 and turns on Id2.

This provides a substantially full discharge to zero from Vcp. The individual current sources may, consistent with the above description, be of known types. The innovative arrangement of circuit 18 uses the best capabilities of both cascoded and simple current mirror sources.

Further description of voltage ramp generators, including those like circuit 18, is contained in copending application Ser. No. 736,524 referred to above which is herein incorporated by reference.

Each of the improvements described may be used individually or in any combination in a driver circuit. They each contribute to providing high performance yet do not require large area in integrated circuits, and multiple high side drivers with any of these features may be readily integrated together.

Embodiments of the invention may of course vary from those specifically shown or described herein.

What is claimed is:

1. A driver circuit, for a power driving stage with a power device, comprising:

an amplifier connected to receive an input signal for transitioning conduction of the power device, from on to off and from off to on, the amplifier having an output connected to a control terminal of the power device;

a first power supply for supplying a supply voltage across a channel of the power device;

a second power supply for supplying a charge pump voltage, of a magnitude greater than the supply voltage, for biasing the amplifier; and means for operating the amplifier in a switching mode wherein the amplifier draws current from the second power supply during transitions of the power device between on and off conditions and draws substantially zero current from the second power supply at times other than said transitions, the means for operating the amplifier in a switching mode comprising one or more threshold detectors connected to detect on and off conditions of the power device and to cause the amplifier to be off except during said transitions.

2. The driver circuit of claim 1 wherein:

the second power supply has additional connections to supply charge pump voltage to one or more other drive circuits of one or more other respective power devices with each of the other driver circuits including a respective other amplifier arranged to operate in a switching mode.

3. The driver circuit of claim 2 wherein:

the power devices and their driver circuits are contained within a single integrated circuit chip;

the first power supply is external to the integrated circuit chip; and the second power supply charge pump voltage is internally generated by elements within the chip powered by the first power supply.

4. The driver circuit of claim 3 wherein:

the conduction of the power devices selectively energizes coils of a motor driving data storage apparatus.

5. The driver circuit of claim 1 wherein:

the power device is an MOS transistor having a channel for conduction between source and drain terminals and its control terminal is a gate terminal.

6. A method of operating a driver circuit for a power driving stage where the power driving stage includes a power device supplied by a first voltage from a first power supply and the driver circuit includes an amplifier biased by a charge pump voltage from a second, charge pump, power supply that is higher than the first voltage, the amplifier having an output terminal connected to the gate of the power device and an input connected to a slew rate control circuit, comprising:

sensing a gate voltage of the power device;

sensing the voltage at the amplifier input;

comparing the sensed voltages with high and low threshold voltages;

generating an enable signal to the amplifier when the power device is to be transitioned from on to off or off to on;

generating a disable signal to the amplifier when the power device is to remain on or off.

7. The method of claim 6, further comprising:

applying drive circuit command signals to an input of the driver circuit, said signals varying between a first, low, level and a second, high, level, wherein changes between the two levels command the initiation of a transition from on to off or off to on of the power device.

8. The method of claim 7 wherein:

the command signals are applied to a means for performing the comparing of the sensed voltages; and the command signals are also applied to a circuit branch coupled to the amplifier input.

9. The method of claim 8 further comprising:

delaying the application of command signals to the circuit branch coupled to the amplifier input, for an interval, after the command signals are applied to the means for comparing.

10. A driver circuit, for controlling the voltage at a control terminal of a power device that supplies a load, the power device having a first voltage supply to a conduction path whose conduction is controlled by the control terminal between on and off conditions, comprising:

an amplifier supplied by a second voltage supply at a higher voltage than the first voltage supply of the power device, the amplifier having an input varying according to command signals to turn on or off the power device, means for operating the amplifier in a switching mode wherein a bias current is drawn from the second voltage supply only during transitions of the power device between on and off conditions; and a voltage ramp generator for supplying the input of the amplifier with a slew rate controlled input voltage, the generator including a capacitor connected with a plurality of current sources connected for charging and discharging in response to the command signals and including a charging current source for charging the capacitor to a maximum voltage sufficient for complete turn on of the power device and a pair of discharging current sources for discharging the capacitor;

the pair of discharging current sources being connected for sequential operation with a first discharging current source discharging the capacitor from its maximum voltage to a lower value above zero and a second discharging current source discharging the capacitor from the lower value substantially to zero.

11. The driver circuit of claim 10 wherein:

the means for operating the amplifier in a switching mode comprises one or more threshold detectors connected to monitor voltage at one or more of the input and output of the amplifier and compare each monitored voltage to a reference indicating whether a transition has been completed.

12. The driver circuit of claim 10 further comprising:

a preslewing circuit to drop voltage on the power device control terminal, during a transition from on to off, from a first level substantially equal to the voltage of the second voltage supply to a second level substantially equal to the voltage of the first voltage supply;

the preslewing circuit comprising a combination of transistors including a bipolar transistor and a pair of serially connected complementary field effect transistors of which one is connected to receive the command signals at its gate and the other is connected to receive a voltage substantially equal to the first voltage supply at its gate.

13. The driver circuit of claim 12 wherein:

the means for operating the amplifier in a switching mode comprises one or more threshold detectors connected to monitor voltage at one or more of the input and output of the amplifier and compare each monitored voltage to a reference indicating whether a transition has been completed; and in the preslewing circuit, the bipolar transistor is connected in a first circuit branch between the power device control terminal and ground and the complementary pair of field effect transistors is connected in a second circuit branch between the power device control terminal and ground, the bipolar transistor has a base connected to a source of said other field effect transistor, said other field effect transistor source also connected through a resistor to the bipolar transistor emitter, the emitter and collector of the bipolar transistor are connected respectively to the power device control terminal and ground, said one field effect transistor has its source connected to ground and its drain connected to the drain of said other field effect transistor.

14. A driver circuit, for controlling the voltage at a control terminal of a power device that supplies a load, the power device having a first voltage supply to a conduction path whose conduction is controlled by the control terminal between on and off conditions, comprising:

an amplifier supplied by a second voltage supply at a higher voltage than the first voltage supply of the power device, the amplifier having an input varying according to command signals to turn on or off the power device, means for operating the amplifier in a switching mode wherein a bias current is drawn from the second voltage supply only during transitions of the power device between on and off conditions; and a preslewing circuit to drop voltage on the power device control terminal, during a transition from on to off, from a first level substantially equal to the voltage of the second voltage supply to a second level substantially equal to the voltage of the first voltage supply;

the preslewing circuit comprising a combination of transistors including a bipolar transistor and a pair of serially connected complementary field effect transistors of which one is connected to receive the command signals at its gate and the other is connected to receive a voltage substantially equal to the first voltage supply at its gate.

15. The driver circuit of claim 14 wherein:

the means for operating the amplifier in a switching mode comprises one or more threshold detectors connected to monitor voltage at one or more of the input and output of the amplifier and compare each monitored voltage to a reference indicating whether a transition has been completed; and in the preslewing circuit, the bipolar transistor is connected in a first circuit branch between the power device control terminal and ground and the complementary pair of field effect transistors is connected in a second circuit branch between the power device control terminal and ground, the bipolar transistor has a base connected to a source of said other field effect transistor, said other field effect transistor source also connected through a resistor to the bipolar transistor emitter, the emitter and collector of the bipolar transistor are connected respectively to the power device control terminal and ground, said one field effect transistor has its source connected to ground and its drain connected to the drain of said other field effect transistor.

16. A driver circuit, for controlling the voltage at a control terminal of a power device that supplies a load, the power device having a first voltage supply to a conduction path whose conduction is controlled by the control terminal between on and off conditions, comprising:

an amplifier supplied by a second voltage supply at a higher voltage than the first voltage supply of the power device, the amplifier having an input varying according to command signals to turn on or off the power device;

a preslewing circuit to drop voltage on the power device control terminal, during a transition from on to off, from a first level substantially equal to the voltage of the second voltage supply to a second level substantially equal to the voltage of the first voltage supply;

the preslewing circuit comprising a combination of transistors including a bipolar transistor and a pair of serially connected complementary field effect transistors of which one is connected to receive the command signals at its gate and the other is connected to receive a voltage substantially equal to the first voltage supply at its gate;

a voltage ramp generator for supplying the input of the amplifier with a slew rate controlled input voltage, the generator including a capacitor connected with a plurality of current sources connected for charging and discharging in response to the command signals and including a charging current source for charging the capacitor to a maximum voltage sufficient for complete turn on of the power device and a pair of discharging current sources for discharging the capacitor;

the pair of discharging current sources being connected for sequential operation with a first discharging current source discharging the capacitor from its maximum voltage to a lower value above zero and a second discharging current source discharging the capacitor from the lower value substantially to zero.

17. The driver circuit of claim 16 wherein:

in the preslewing circuit, the bipolar transistor is connected in a first circuit branch between the power device control terminal and ground and the complementary pair of field effect transistors is connected in a second circuit branch between the power device control terminal and ground, the bipolar transistor has a base connected to a source of said other field effect transistor, said other field effect transistor source also connected through a resistor to the bipolar transistor emitter, the emitter and collector of the bipolar transistor are connected respectively to the power device control terminal and ground, said one field effect transistor has its source connected to ground and its drain connected to the drain of said other field effect transistor.

18. A driver circuit, for a power driving stage with a power device, comprising:

an amplifier connected to receive an input signal for transitioning conduction of the power device, from on to off and from off to on, the amplifier having an output connected to a control terminal of the power device;

a first power supply for supplying a supply voltage across a channel of the power device;

a second power supply for supplying a charge pump voltage, of a magnitude greater than the supply voltage, for biasing the amplifier; and means for operating the amplifier in a switching mode wherein the amplifier draws current from the second power supply during transitions of the power device between on and off conditions and draws substantially zero current from the second power supply at times other than said transitions, the means for operating the amplifier in a switching mode comprises a capacitor connected to an input to the amplifier that is arranged to be charged according to command signals for commutating the conduction of the power device.

19. The driver circuit of claim 18 wherein:

the threshold detectors are connected to receive signals representing the voltage on the capacitor and a voltage at a control terminal of the power device respectively; and said threshold detectors are connected to supply an enable signal to switch the amplifier on for a transition of the power device and a disable signal to switch the amplifier off during periods in which the power device is fully off or on.

20. The driver circuit of claim 19 wherein:

the capacitor is arranged to reach a maximum charge voltage when the power device is fully on and to reach a minimum charge voltage when the power device is fully off.

21. The driver circuit of claim 18 wherein:

the capacitor is connected to establish a slew rate for transitions of the power device.

22. The driver of claim 21 wherein:

the capacitor is charged by a first constant current source connected between the second power supply and a first capacitor terminal and is discharged by a second constant current source connected between the first capacitor terminal and a ground reference.

* * * * *